United States Patent [19]

Chaki

[11] Patent Number: 4,607,537

[45] Date of Patent: Aug. 26, 1986

[54] PUSHBUTTON TUNER

[75] Inventor: Takao Chaki, Tokyo, Japan

[73] Assignee: Clarion Co., Ltd., Tokyo, Japan

[21] Appl. No.: 569,506

[22] Filed: Jan. 9, 1984

[30] Foreign Application Priority Data

Jan. 12, 1983 [JP] Japan ............................ 58-2295[U]
Jan. 12, 1983 [JP] Japan ............................ 58-2297[U]

[51] Int. Cl.[4] ........................................... H03J 5/12
[52] U.S. Cl. ........................................ 74/10.33; 334/7
[58] Field of Search ........................... 74/10.33; 334/7

[56] References Cited

U.S. PATENT DOCUMENTS 3,946,344 3/1976 Wilkinson ......................... 74/10.33
4,030,052 6/1977 Pelletier ............................ 74/10.33
4,226,128 10/1980 Dellantonio ....................... 74/10.33

FOREIGN PATENT DOCUMENTS 150610 11/1980 Japan ................................. 74/10.33

Primary Examiner—Alan Cohan
Assistant Examiner—John A. Rivell
Attorney, Agent, or Firm—Russell E. Hattis; Stephen R. Arnold

[57] ABSTRACT

The pushbutton tuner includes a connection member which connects a memory slide plate for transverse displacement in response to tuning operation to a change lever responsive to the memory slide plate to actuate a tuning circuit element. The connection member particularly consists of first step for engagement with the memory slide plate, second step for engagement with the change lever, and a flat portion connecting the both steps.

3 Claims, 6 Drawing Figures

PUSHBUTTON TUNER

FIELD OF THE INVENTION

This invention relates to a pushbutton tuner, and more particularly to an improvement thereof for saving space for placement of its constituent parts and leading to reduction in size and thickness of the overall tuner mechanism.

BACKGROUND OF THE INVENTION

Tuner mechanisms in car radios are generally compatible with manual and automatic tuning operations. A tuning operation is effected by manually rotating a manual tuning knob or by pushing a pushbutton to which a desired broadcasting station is previously reserved. Both the rotation of the manual turning knob and the displacement of the pushbutton are finally transmitted to a tuning circuit element for varying the frequency selection.

FIG. 1 is a schematic view of main components relating to tuning operation of one of such prior art pushbutton tuners. To effect manual tuning operation, the manual tuning knob 1 is manually rotated to displace a memory slide plate 3 transversely. The displacement of the memory slide 3 is transmitted to a change lever 5 via a connection member 4. The change lever 5 then changes a constant of a tuning circuit element 6 such as an inductance element, for example. To effect automatic tuning operation, a desired frequency is preset to a pushbutton 7 by said manual tuning operation so that the memory slide plate 3 always moves to a determined position corresponding to the desired frequency when the pushbutton 7 is pushed. As well known, a lever 8 fixed to the pushbutton 7 carries a cam-shaped frequency setting plate 11 which has a pin 9 and is pivotal about the point 10. The frequency setting plate 11 is sandwiched by a pair of lock plates 12a and 12b. If the pushbutton 7 is pushed into the tuner toward the memory slide plate 3, the pin 9 contacts and is guided by a wave-shaped edge 13 of the memory slide plate 3. When the pin 9 falls in one of the ravines of the wave-shaped edge 13, the frequency setting plate 11 is forcibly seized by the lock plates 12a and 12b and locked there unrotatably. Thereafter, by merely pushing the pushbutton 7, the pin 9 associated to the pushbutton 7 and now fixed in its angular position pushes the wave-shaped edge 13 of the memory slide plate 3 and displaces it to the position corresponding to the preset frequency whereat the pin 9 falls into the ravine. The displacement of the memory slide plate 3 is transmitted to the tuning circuit element 6 via the connection member 4 to change its value and select the reserved frequency.

The connection member 4 used in prior art tuners for transmitting the displacement of the memory slide plate 3 to the tuning circuit element 6 upon operation of the tuning knob 1 or of the pushbutton 7 bridges a pin 14A projecting from the memory slide plate 3 and a pin 14B projecting from a frame 15 of the radio. Additionally, a spring 16 is parallelly provided above the connection member 4 to maintain reliable linkage between the memory slide plate 3 and the change lever 5.

With this structure, however, a considerably large distance D is required between the memory slide plate 3 and the frame 15 for assembly of the connection member 4 and the spring 16. Additionally, since the connection member 4 and the spring 16 must be assembled in a limited space around or just under the tuning circuit element 6 which is already assembled, the assembling work is extremely difficult.

In the prior art tuner, an intermediary member such as the change lever 5 for transmitting the displacement of the memory slide plate 3 to the tuning circuit element 6 also occupies a space and disturbs reduction of size of the tuner because the change lever 5 horizontally juts out from the tuning circuit element 6.

OBJECT OF THE INVENTION

It is therefore an object of the present invention to provide a connection member enabling reduction of thickness of the pushbutton tuner.

A further object of the invention is to save the space for placement of the constituent parts of the pushbutton tuner to reduce the overall dimension of the tuner.

SUMMARY OF THE INVENTION

In accordance with the present invention, there is provided a pushbutton tuner employing a connection member which has a first step for engagement with the memory slide transversely movable in response to a tuning operation, a second step for engagement with the change lever for transmitting the transverse movement of the memory slide plate to the tuning circuit element, and a flat portion connecting the first and second steps. The change lever in the invention tuner is disposed in lamination with the tuning circuit element.

BRIEF DESCRIPTION OF THE DRAWINGS

FIG. 3b is a side view of the connection member of FIG. 3a;

FIG. 4a is a plan view illustrating placement of a change lever in the pushbutton tuner embodying the present invention; and FIG. 4b is a side view of the components illustrated in FIG. 4a.

DETAILED DESCRIPTION OF THE PREFERRED EMBODIMENT

The invention will now be described in detail by way of a preferred embodiment illustrated in FIGS. 3a, 3b, 4a and 4b.

Figure 1:
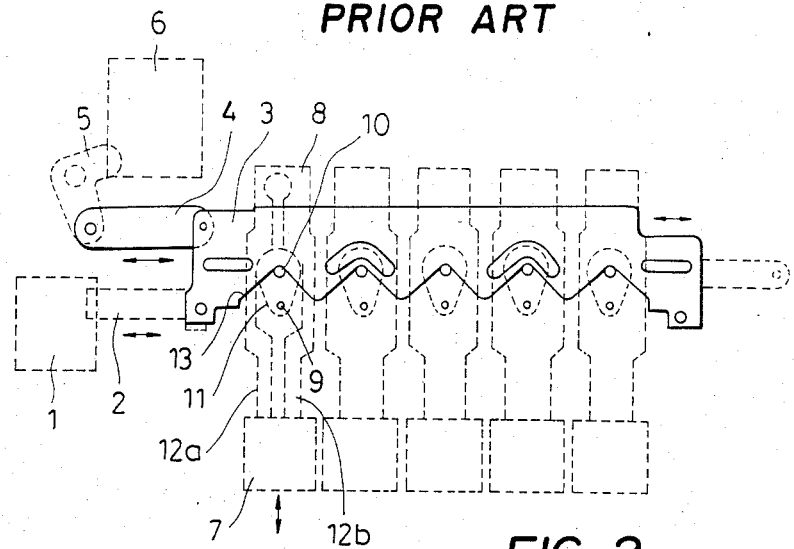
FIG. 1 shows a general construction of a pushbutton tuner.
Figure 2:
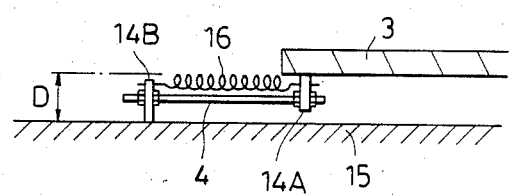
FIG. 2 is a sectional view illustrating a connection member and other adjacent parts employed in the prior art tuner.
Figure 3A:
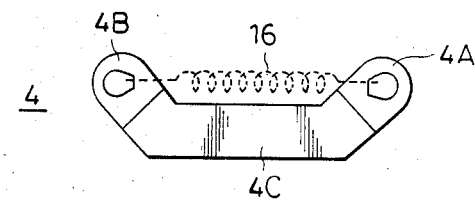
FIG. 3a is a plan view of the connection member employed in a pushbutton tuner embodying the present invention.
Figure 3B:
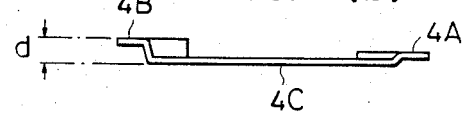

In FIGS. 3a and 3b, the connection member 4 is an elongated plate consisting of first step 4A at one end thereof, second step 4B at the other end thereof, and a flat portion 4C connectng the both steps 4A and 4B. The first step 4A has a hole for engagement with the pin 14A of the memory slide plate 3 whilst the second step 4B has a hole for engagement with a pin formed on the change lever 5. The spring 16 connects the both pins inserted in the first and second steps 4A and 4B to ensure a reliable linkage between the memory slide plate 3 and the change lever 5. The both steps 4A and 4B are bent to make an angle with the flat portion 4C so that the spring 16 connecting the both pins extends aside of one side edge of the flat portion 4C. It should be noted that the connection member 4 can be formed in one body.

With this construction, the connection member 4 and the spring 16 can be placed horizontally side by side instead of placing them in up and down two rows. Therefore, they merely occupy the height d as shown in FIG. 3b and lead to reduction of the overall thickness of the tuner. Additionally, since the construction does not require so large space for assembling work, the spring 16, in particular, can be readily assembled in the tuner. This improves assembling efficiency.

Figure 4:
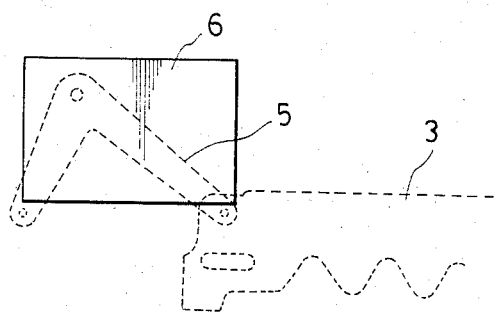
Figure 4:
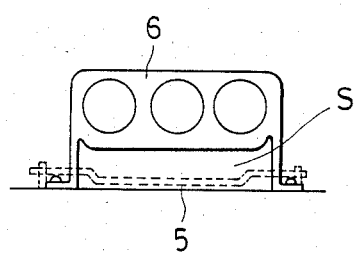

As shown in FIGS. 4a and 4b, the tuning circuit element 6 may be mounted on the base plate slightly distant therefrom to place the change lever 5 in the space S under the tuning circuit element 6.

As described above, the pushbutton tuner according to the invention employs the connection member 4 which consists of the first step 4A connected to the memory slide plate 3, transversely movable in response to tuning operation, the second step connected to the change lever 5 for transmitting the transverse displacement of the memory slide plate 3 to the tuning circuit element 6, and the flat portion connecting the both steps 4A and 4B, the both steps 4A and 4B making an angle with the flat portion 4C so that a line connecting both connection points of the steps 4A and 4B with the memory slide plate 3 and the change lever 6 is horizontally parallel with and never overlaps the flat portion 4C. Therefore, the thickness of the pushbutton can be reduced.

Additionally, placement of the change lever under the tuning circuit element saves horizontal placement area for the change lever 5 and reduces the overall dimensions of the pushbutton tuner.

The embodiments of the invention in which an exclusive property or privilege is claimed are defined as follows:

1. A pushbutton tuner which comprises:
    a memory slide plate mounted for transverse displacement in response to a tuning operation;
    a change lever responsive to said memory slide plate to actuate a tuning circuit element;
    first and second pivoting means affixed to said memory slide plate and said change lever respectively; and
    a generally planar connector member having a strap-shaped central portion and generally planar first and second ends thereof configured to pivotally engage said first and second pivoting means respectively, said ends of said connector member being disposed to diverge away from the axis of said central portion to engage said pivoting means on a common side of said axis, the planes of said end portions being disposed displaced from the plane of said central portion, parallel thereto, and offset on a common side therefrom.

2. A pushbutton tuner as set forth in claim 1 further including a spring bridging said end portions and attractingly connected between said pivoting means.

3. A pushbutton tuner as set forth in claim 1 wherein said change lever is placed under said tuning circuit element.

* * * * *